US011888100B2

(12) United States Patent
Shimizu et al.

(10) Patent No.: US 11,888,100 B2
(45) Date of Patent: Jan. 30, 2024

(54) LED ARRAY WITH LIGHT INTENSITY ADAPTIVE LED SIDEWALLS

(71) Applicant: LUMILEDS LLC, San jose, CA (US)

(72) Inventors: Kentaro Shimizu, Sunnyvale, CA (US); Marcel Rene Bohmer, Eindhoven (NL); Daniel Estrada, Santa Cruz, CA (US); Jacobus Johannes Franciscus Gerardus Heuts, Roermond (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/967,174

(22) Filed: Oct. 17, 2022

(65) Prior Publication Data

US 2023/0043996 A1    Feb. 9, 2023

Related U.S. Application Data

(63) Continuation of application No. 16/912,496, filed on Jun. 25, 2020, now Pat. No. 11,489,095, which is a
(Continued)

(30) Foreign Application Priority Data

Mar. 19, 2018   (EP) ..................................... 18162551
Aug. 28, 2018   (EP) ..................................... 18191100

(51) Int. Cl.
*H01L 33/58*    (2010.01)
*G02F 1/01*    (2006.01)
(Continued)

(52) U.S. Cl.
CPC ............ *H01L 33/58* (2013.01); *F21S 41/141* (2018.01); *F21S 41/40* (2018.01); *F21V 14/003* (2013.01);
(Continued)

(58) Field of Classification Search
CPC ............ H01L 27/3218; H01L 27/3216; H01L 27/3276; H01L 51/5212; H01L 27/3262;
(Continued)

(56) References Cited

U.S. PATENT DOCUMENTS 5,867,238 A    2/1999 Miller et al.
5,916,837 A    6/1999 Harmer et al.
(Continued)

FOREIGN PATENT DOCUMENTS

CN    103392093 A    11/2013
CN    104798125 A     7/2015
(Continued)

OTHER PUBLICATIONS

International Application Serial No. PCT/EP2018/085445, International Preliminary Report on Patentability dated Jul. 2, 2020, 9 pages.
(Continued)

*Primary Examiner* — Tracie Y Green

(57) ABSTRACT

A first LED with a first LED sidewall is disclosed. A second LED with a second LED sidewall facing the first LED sidewall is also disclosed. A first dynamic optical isolation material between the first LED sidewall and the second LED sidewall and configured to change an optical state based on a state trigger such that a light behavior at the first LED sidewall for a light emitted by one of the first LED and the second LED is determined by the optical state, is also disclosed.

20 Claims, 12 Drawing Sheets

Related U.S. Application Data continuation of application No. 16/226,487, filed on Dec. 19, 2018, now Pat. No. 11,557,703.

(60) Provisional application No. 62/609,202, filed on Dec. 21, 2017.

(51) Int. Cl.

| | | |
|---|---|---|
| *H01L 33/50* | (2010.01) | |
| *H01L 25/075* | (2006.01) | |
| *G02F 1/163* | (2006.01) | |
| *G02F 1/015* | (2006.01) | |
| *H01L 27/15* | (2006.01) | |
| *F21S 41/40* | (2018.01) | |
| *F21S 41/141* | (2018.01) | |
| *F21V 14/00* | (2018.01) | |
| *H01L 51/52* | (2006.01) | |
| *H10K 50/86* | (2023.01) | |
| *F21V 23/00* | (2015.01) | |
| *F21S 41/64* | (2018.01) | |
| *F21Y 115/10* | (2016.01) | |
| *F21V 23/02* | (2006.01) | |

(52) U.S. Cl.
CPC ............ *G02F 1/015* (2013.01); *G02F 1/0126* (2013.01); *G02F 1/0147* (2013.01); *G02F 1/163* (2013.01); *H01L 25/0753* (2013.01); *H01L 27/156* (2013.01); *H01L 33/50* (2013.01); *H10K 50/865* (2023.02); *F21S 41/64* (2018.01); *F21S 41/645* (2018.01); *F21V 23/005* (2013.01); *F21V 23/02* (2013.01); *F21Y 2115/10* (2016.08); *G02F 2203/01* (2013.01); *G02F 2203/02* (2013.01); *G02F 2203/03* (2013.01); *H01L 2933/0091* (2013.01)

(58) Field of Classification Search
CPC . H01L 27/3265; H01L 27/3213; H01L 51/56; G09G 3/3208; G09G 3/3225; G09G 3/3233; G02F 1/134309
See application file for complete search history.

(56) References Cited

U.S. PATENT DOCUMENTS

| | | | |
|---|---|---|---|
| 8,390,021 B2 * | 3/2013 | Nagai | H01L 27/156 |
| | | | 257/E33.061 |
| 8,462,080 B2 | 6/2013 | Jang et al. | |
| 8,921,840 B2 | 12/2014 | Kim et al. | |
| 8,931,840 B2 | 1/2015 | Huang | |
| 9,117,776 B2 | 8/2015 | Kim et al. | |
| 9,159,890 B2 | 10/2015 | Moosburger et al. | |
| 9,431,635 B2 | 8/2016 | Heuser et al. | |
| 9,508,908 B2 | 11/2016 | Vampola et al. | |
| 9,857,049 B2 | 1/2018 | Chung et al. | |
| 9,891,350 B2 | 2/2018 | Lofftus et al. | |
| 10,629,577 B2 * | 4/2020 | Tao | H01L 27/1214 |
| 10,892,387 B2 | 1/2021 | Pfeffer et al. | |
| 10,928,660 B2 | 2/2021 | Kim et al. | |
| 11,489,095 B2 | 11/2022 | Shimizu et al. | |
| 11,557,703 B2 | 1/2023 | Shimizu et al. | |
| 2008/0187746 A1 | 8/2008 | DeGraaf et al. | |
| 2009/0086508 A1 | 4/2009 | Bierhuizen | |
| 2009/0212697 A1 | 8/2009 | Nakamura et al. | |
| 2011/0141544 A1 | 6/2011 | Suzuki et al. | |
| 2013/0329440 A1 | 12/2013 | Tsutsumi et al. | |
| 2014/0043668 A1 | 2/2014 | Bergh et al. | |
| 2014/0085274 A1 | 3/2014 | Lewis | |
| 2014/0098547 A1 | 4/2014 | Kostelnik | |
| 2014/0124749 A1 | 5/2014 | Kim et al. | |
| 2014/0246690 A1 | 9/2014 | Moosburger et al. | |
| 2014/0376076 A1 | 12/2014 | Chen | |
| 2015/0036373 A1 | 2/2015 | Chen | |
| 2015/0277164 A1 | 10/2015 | Nagase et al. | |
| 2016/0070410 A1 | 3/2016 | Lin et al. | |
| 2016/0085131 A1 | 3/2016 | Lam et al. | |
| 2016/0284302 A1 | 9/2016 | Tomikawa et al. | |
| 2016/0293682 A1 | 10/2016 | Park | |
| 2017/0012026 A1 | 1/2017 | Choi | |
| 2017/0069606 A1 | 3/2017 | Gould et al. | |
| 2017/0075314 A1 | 3/2017 | Perez-Feliciano | |
| 2017/0212398 A1 | 7/2017 | Cao et al. | |
| 2017/0294418 A1 * | 10/2017 | Edmond | H01L 33/46 |
| 2017/0310956 A1 | 10/2017 | Perdices-Gonzalez et al. | |
| 2017/0337031 A1 | 11/2017 | Kaufmann et al. | |
| 2018/0097045 A1 | 4/2018 | Maeda | |
| 2018/0138430 A1 | 5/2018 | Chu et al. | |
| 2019/0016907 A1 | 1/2019 | Kagan et al. | |
| 2019/0195456 A1 | 6/2019 | Pfeffer et al. | |
| 2019/0198732 A1 | 6/2019 | Shimizu et al. | |
| 2020/0328333 A1 | 10/2020 | Shimizu et al. | |

FOREIGN PATENT DOCUMENTS

| | | |
|---|---|---|
| CN | 106019688 A | 10/2016 |
| CN | 106707595 A | 5/2017 |
| CN | 107452779 A | 12/2017 |
| DE | 102013101530 A1 | 8/2014 |
| GB | 2433640 A | 6/2007 |
| JP | 2004-239935 A | 8/2004 |
| JP | 6186904 B2 | 8/2017 |
| JP | 2017-204551 A | 11/2017 |
| KR | 2007-0066488 A | 6/2007 |
| KR | 2015-0069364 A | 6/2015 |
| TW | 201608319 A | 3/2016 |
| TW | 201624029 A | 7/2016 |
| TW | 201731093 A | 9/2017 |
| WO | 2012/079159 A1 | 6/2012 |
| WO | 2016/190855 A1 | 12/2016 |
| WO | 2017/014926 A1 | 1/2017 |
| WO | 2017/104313 A1 | 6/2017 |
| WO | 2017/134589 A1 | 8/2017 |
| WO | 2017/157473 A1 | 9/2017 |
| WO | 2017/222298 A1 | 12/2017 |
| WO | 2019/121650 A1 | 6/2019 |

OTHER PUBLICATIONS

U.S. Appl. No. 16/228,393, Final Office Action dated Jul. 7, 2020, 16 pages.
International Application Serial No. PCT/US2018/067193, International Preliminary Report on Patentability dated Jul. 2. 2020, 9 pages.
U.S. Appl. No. 16/228,393, Response filed May 26, 2020 to Non-Final Office Action dated Feb. 27, 2020, 9 pages.
U.S. Appl. No. 16/228,393, Notice of Allowance dated Sep. 21, 2020, 11 pages.
U.S. Appl. No. 16/228,393, filed Dec. 20, 2018 "Lighting Device with Switching Material".
Extended European Search Report corresponding to EP Application No. 18162551.8 dated Sep. 4, 2018, 9 pages.
Chinese Application Serial No. 201880082403.1, Voluntary Amendment filed Mar. 16, 2021, (w/English translation), 8 pages.
Korean Application No. 10-2020-7021086, Amendment filed Jul. 22, 2020, (w/English translation), 11 pages.
U.S. Appl. No. 16/228,393, Non-Final Office Action dated Feb. 27, 2020, 13 pages.
International Application No. PCT/US2018/067193, International Search Report dated Mar. 6, 2019, 4 pages.
International Application No. PCT/US2018/067193, Written Opinion dated Mar. 6, 2019, 7 pages.
International Application No. PCT/EP2018/085445, International Search Report dated Feb. 4, 2019, 3 pages.
International Application No. PCT/EP2018/085445, Written Opinion dated Feb. 4, 2019, 7 pages.
U.S. Appl. No. 16/228,393, Response filed Sep. 3, 2020 to Final Office Action dated Jul. 7, 2020, 9 pages.

(56) References Cited

OTHER PUBLICATIONS

U.S. Appl. No. 16/912,496, Notice of Allowance dated Jul. 12, 2022, 7 pages.
Liu et al., "Paperlike thermochromic display", Applied Physics Letters, 2007, 90, (Year: 2007).
Daisuke Iwai, Shoichi Takeda, Naoto Hino, and Kosuke Sato, Projection screen reflectance control for high contrast display using photochromic compounds and UV LEDs, Opt. Express 22, 13492-13506 (2014), (Year: 2014).
CN106019688a, machine translation_espacenet (Year: 2017).
European Search Report corresponding to EP18162551, dated Aug. 24, 2018, 2 pages.
Office Action in counterpart U.S. Appl. No. 16/226,487 dated Apr. 28, 2022, 16 pages.

* cited by examiner

LED ARRAY WITH LIGHT INTENSITY ADAPTIVE LED SIDEWALLS

CROSS REFERENCE TO RELATED APPLICATIONS

This application is a continuation of U.S. patent application Ser. No. 16/912,496, filed Jun. 25, 2020, which is a continuation of U.S. patent application Ser. No. 16/226,487, filed Dec. 19, 2018, which claims benefit of priority to U.S. Provisional Application No. 62/609,202 filed Dec. 21, 2017, to European Patent Application No. 18162551.8 filed Mar. 19, 2018, and to European Patent Application No. 18191100.9 filed Aug. 28, 2018. Each of the above patent applications is incorporated herein by reference in its entirety.

BACKGROUND

Precision control lighting applications can require production and manufacturing of small addressable light emitting diode (LED) pixel systems. Manufacturing such LED pixel systems can require accurate deposition of material due to the small size of the pixels and the small lane space between the systems.

Semiconductor light-emitting devices including LEDs, resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride devices are often formed as inverted or flip chip devices, where both the n- and p-contacts formed on the same side of the semiconductor structure, and most of the light is extracted from the side of the semiconductor structure opposite the contacts.

SUMMARY

A first pixel with a first pixel sidewall is disclosed. A second pixel with a second pixel sidewall facing the first pixel sidewall is also disclosed. A first dynamic optical isolation material between the first pixel sidewall and the second pixel sidewall and configured to change an optical state based on a state trigger such that a light behavior at the first pixel sidewall for a light emitted by one of the first pixel and the second pixel is determined by the optical state, is also disclosed.

BRIEF DESCRIPTION OF THE DRAWINGS

A more detailed understanding may be had from the following description, given by way of example in conjunction with the accompanying drawings wherein:

FIG. 1H is a cross-section view of a pixel with two dynamic optical isolation material layers;

FIG. 1I is a cross-section view diagram of a pixel array;

DETAILED DESCRIPTION

Figure 1A:
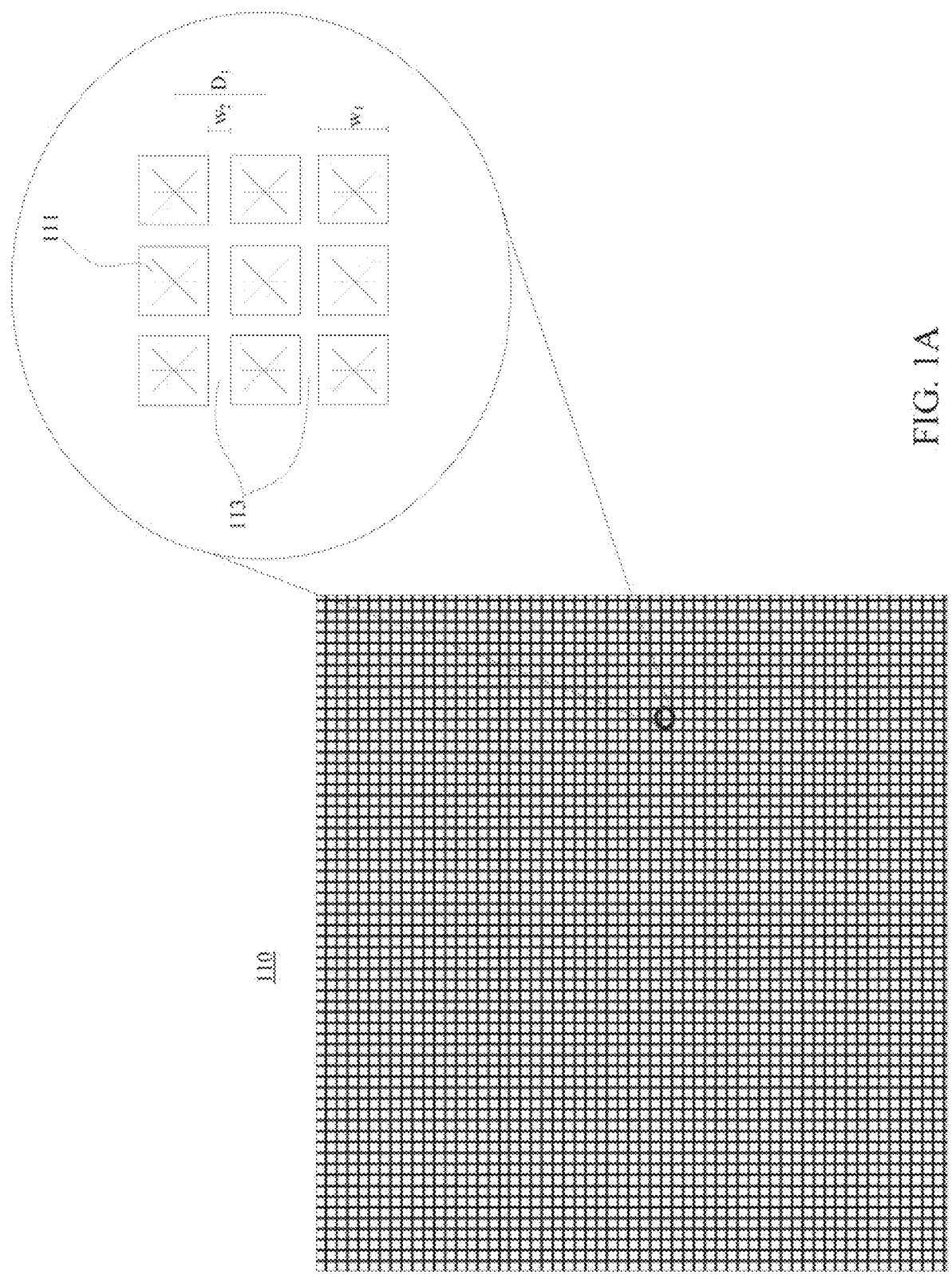
FIG. 1A is a top view illustration of a micro LED array with an exploded portion.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

Figure 1B:
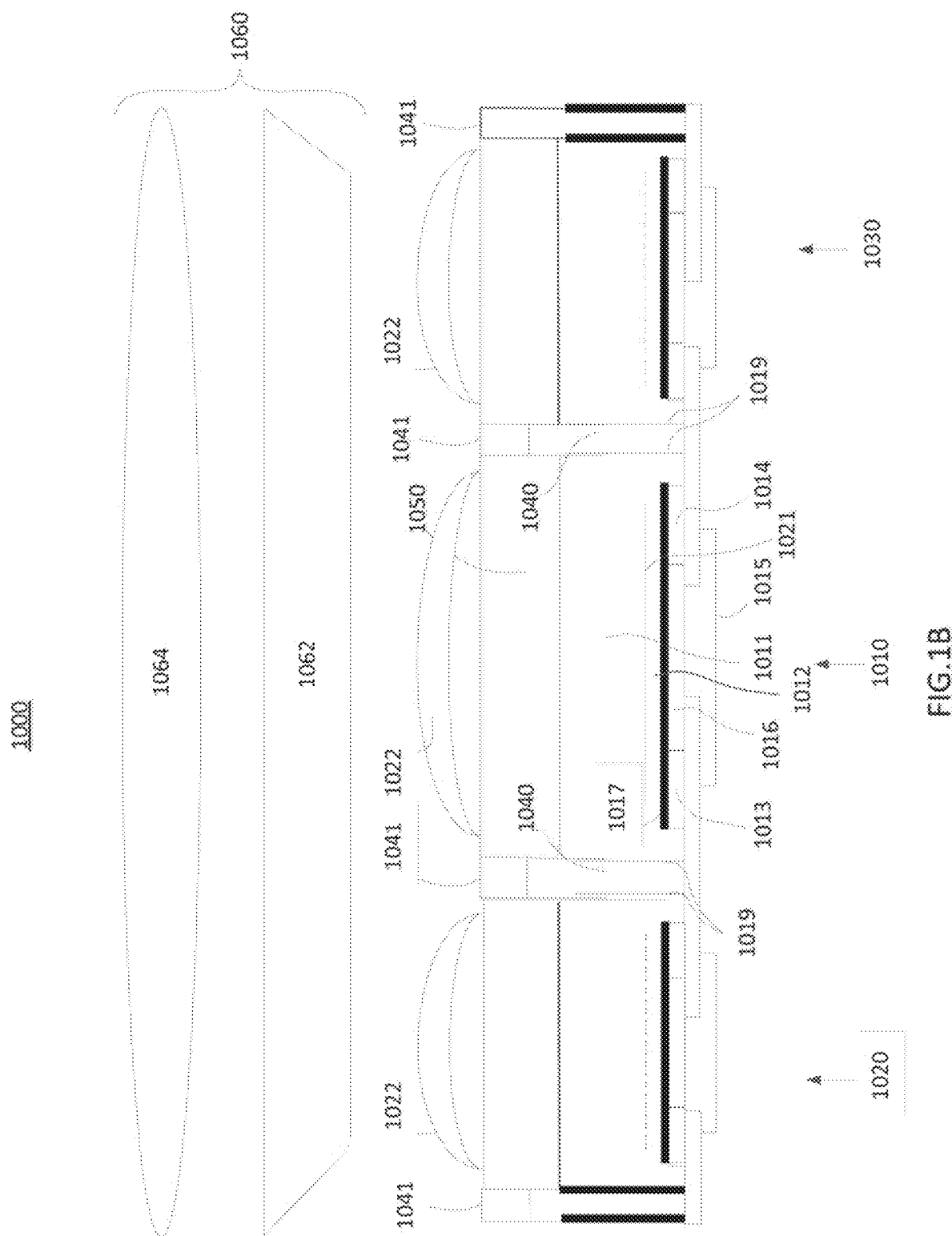
FIG. 1B is a cross sectional illustration of a pixel matrix with trenches.
Figure 1C:
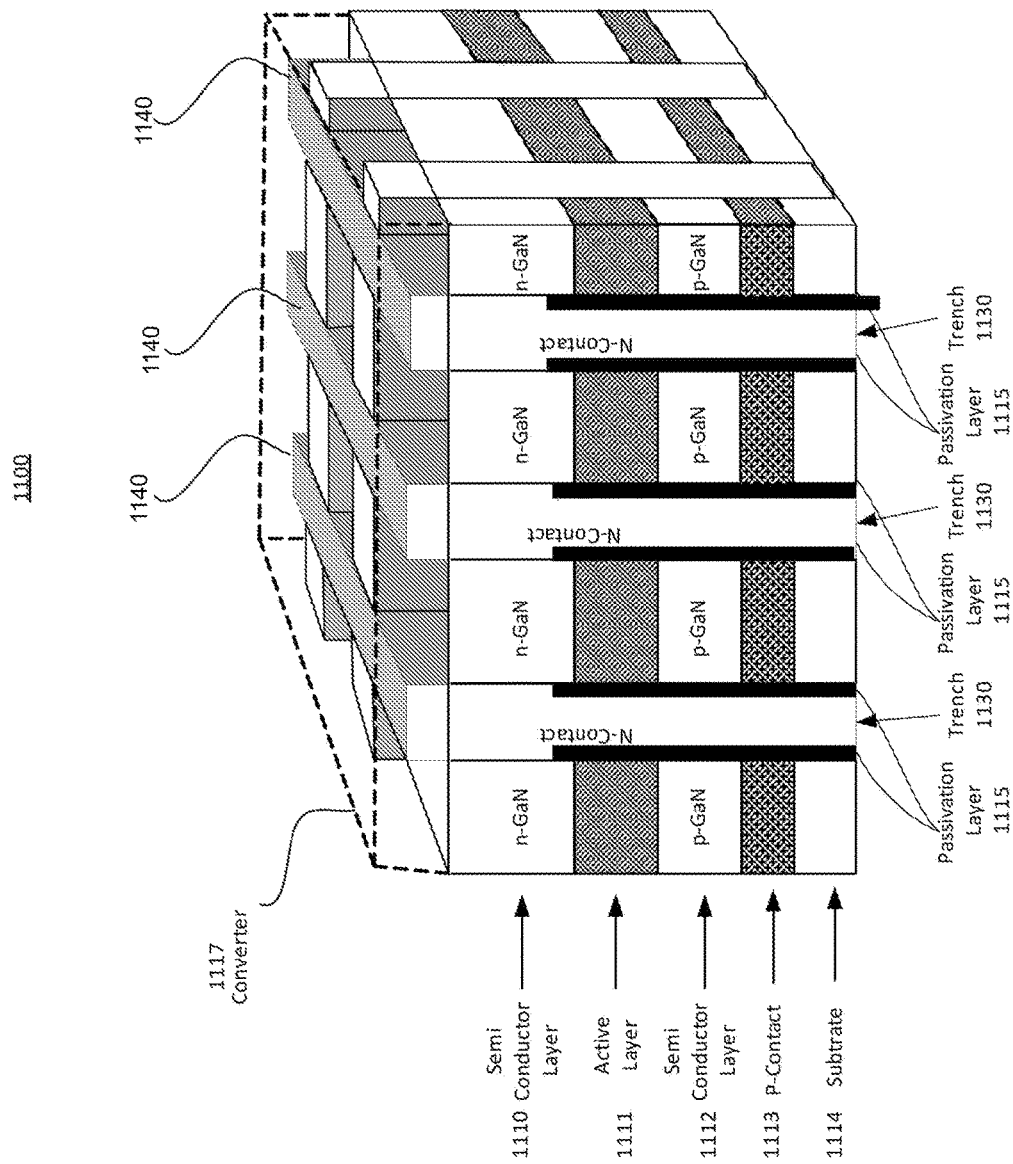
FIG. 1C is a perspective illustration of another pixel matrix with trenches.

According to embodiments of the disclosed subject matter, LED arrays (e.g., micro LED arrays) may include an array of pixels as shown in FIGS. 1A, 1B, and/or 1C. LED arrays may be used for any applications such as those requiring precision control of LED array segments. Pixels in an LED array may be individually addressable, may be addressable in groups/subsets, or may not be addressable. In FIG. 1A, a top view of a LED array 110 with pixels 111 is shown. An exploded view of a 3×3 portion of the LED array 110 is also shown in FIG. 1A. As shown in the 3×3 portion exploded view, LED array 110 may include pixels 111 with a width $w_1$ of approximately 100 μm or less (e.g., 40 μm). The lanes 113 between the pixels may be separated by a width, $w_2$, of approximately 20 μm or less (e.g., 5 μm). The lanes 113 may provide an air gap between pixels or may contain other material, as shown in FIGS. 1B and 1C and further disclosed herein. The distance $d_1$ from the center of one pixel 111 to the center of an adjacent pixel 111 may be approximately 120 μm or less (e.g., 45 μm). It will be understood that the widths and distances provided herein are examples only, and that actual widths and/or dimensions may vary.

It will be understood that although rectangular pixels arranged in a symmetric matrix are shown in FIGS. 1A, B and C, pixels of any shape and arrangement may be applied to the embodiments disclosed herein. For example, LED array 110 of FIG. 1A may include, over 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

FIG. 1B shows a cross section view of an example LED array 1000. As shown, the pixels 1010, 1020, and 1030 correspond to three different pixels within an LED array such that a separation sections 1041 and/or n-type contacts 1040 separate the pixels from each other. According to an embodiment, the space between pixels may be occupied by an air gap. As shown, pixel 1010 includes an epitaxial layer 1011 which may be grown on any applicable substrate such as, for example, a sapphire substrate, which may be removed from the epitaxial layer 1011. A surface of the growth layer distal from contact 1015 may be substantially planar or may be patterned. A p-type region 1012 may be located in proximity to a p-contact 1017. An active region 1021 may be disposed adjacent to the n-type region and a p-type region 1012. Alternatively, the active region 1021 may be between a semiconductor layer or n-type region and p-type region 1012 and may receive a current such that the active region 1021 emits light beams. The p-contact 1017 may be in contact with SiO2 layers 1013 and 1014 as well as plated metal layer 1016 (e.g., plated copper). The n type contacts 1040 may include an applicable metal such as Cu. The metal layer 1016 may be in contact with a contact 1015 which may reflective.

Notably, as shown in FIG. 1B, the n-type contact 1040 may be deposited into trenches 1130 created between pixels 1010, 1020, and 1030 and may extend beyond the epitaxial layer. Separation sections 1041 may separate all (as shown) or part of a wavelength converting layer 1050. It will be understood that a LED array may be implemented without such separation sections 1041 or the separation sections 1041 may correspond to an air gap. The separation sections 1041 may be an extension of the n-type contacts 1040, such that, separation sections 1041 are formed from the same material as the n-type contacts 1040 (e.g., copper). Alternatively, the separation sections 1041 may be formed from a material different than the n-type contacts 1040. According to an embodiment, separation sections 1041 may include reflective material. The material in separation sections 1041 and/or the n-type contact 1040 may be deposited in any applicable manner such as, for example, but applying a mesh structure which includes or allows the deposition of the n-type contact 1040 and/or separation sections 1041. Wavelength converting layer 1050 may have features/properties similar to wavelength converting layer 205 of FIG. 2A. As noted herein, one or more additional layers may coat the separation sections 1041. Such a layer may be a first optical material which may be a reflective layer, a scattering layer, an absorptive layer, or any other applicable layer. One or more passivation layers 1019 may fully or partially separate the n-contact 1040 from the epitaxial layer 1011.

The epitaxial layer 1011 may be formed from any applicable material to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors may have indices of refraction ranging from about 2.4 to about 4.1 at the typical emission wavelengths of LEDs in which they are present. For example, III-Nitride semiconductors, such as GaN, may have refractive indices of about 2.4 at 500 nm, and III-Phosphide semiconductors, such as InGaP, may have refractive indices of about 3.7 at 600 nm. Contacts coupled to the LED device 200 may be formed from a solder, such as AuSn, AuGa, AuSi or SAC solders.

The n-type region may be grown on a growth substrate and may include one or more layers of semiconductor material that include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Similarly, the p-type region 1012 may include multiple layers of different composition, thickness, and dopant concentrations, including layers that are not intentionally doped, or n-type layers. An electrical current may be caused to flow through the p-n junction (e.g., via contacts) and the pixels may generate light of a first wavelength determined at least in part by the bandgap energy of the materials. A pixel may directly emit light (e.g., regular or direct emission LED) or may emit light into a wavelength converting layer 1050 (e.g., phosphor converted LED, "PCLED", etc.) that acts to further modify wavelength of the emitted light to output a light of a second wavelength.

Although FIG. 1B shows an example LED array 1000 with pixels 1010, 1020, and 1030 in an example arrangement, it will be understood that pixels in an LED array may be provided in any one of a number of arrangements. For example, the pixels may be in a flip chip structure, a vertical injection thin film (VTF) structure, a multi-junction structure, a thin film flip chip (TFFC), lateral devices, etc. For example, a lateral LED pixel may be similar to a flip chip LED pixel but may not be flipped upside down for direct connection of the electrodes to a substrate or package. A TFFC may also be similar to a flip chip LED pixel but may have the growth substrate removed (leaving the thin film semiconductor layers un-supported). In contrast, the growth substrate or other substrate may be included as part of a flip chip LED.

The wavelength converting layer 1050 may be in the path of light emitted by active region 1021, such that the light emitted by active region 1021 may traverse through one or more intermediate layers (e.g., a photonic layer). According to embodiments, wavelength converting layer 1050 or may not be present in LED array 1000. The wavelength converting layer 1050 may include any luminescent material, such as, for example, phosphor particles in a transparent or translucent binder or matrix, or a ceramic phosphor element, which absorbs light of one wavelength and emits light of a different wavelength. The thickness of a wavelength converting layer 1050 may be determined based on the material used or application/wavelength for which the LED array 1000 or individual pixels 1010, 1020, and 1030 is/are arranged. For example, a wavelength converting layer 1050 may be approximately 20 µm, 50 µm or 200 µm. The wavelength converting layer 1050 may be provided on each individual pixel, as shown, or may be placed over an entire LED array 1000.

Primary optic 1022 may be on or over one or more pixels 1010, 1020, and/or 1030 and may allow light to pass from the active region 101 and/or the wavelength converting layer 1050 through the primary optic. Light via the primary optic may generally be emitted based on a Lambertian distribution pattern such that the luminous intensity of the light emitted via the primary optic 1022, when observed from an ideal diffuse radiator, is directly proportional to the cosine of the angle between the direction of the incident light and the surface normal. It will be understood that one or more properties of the primary optic 1022 may be modified to produce a light distribution pattern that is different than the Lambertian distribution pattern.

Secondary optics 1060 which include one or both of the lens 1064 and waveguide 1062 may be provided with pixels 1010, 1020, and/or 1030. It will be understood that although secondary optics are discussed in accordance with the example shown in FIG. 1B with multiple pixels, secondary optics may be provided for single pixels. Secondary optics may be used to spread the incoming light (diverging optics), or to gather incoming light into a collimated beam (collimating optics). The waveguide 1062 may be coated with a dielectric material, a metallization layer, or the like and may be provided to reflect or redirect incident light. In alternative embodiments, a lighting system may not include one or more of the following: the wavelength converting layer 1050, the primary optics 1022, the waveguide 1062 and the lens 1065.

Lens 1064 may be formed form any applicable transparent material such as, but not limited to SiC, aluminum oxide, diamond, or the like or a combination thereof. Lens 1064 may be used to modify a beam of light to be input into the lens 1064 such that an output beam from the lens 1065 will efficiently meet a desired photometric specification. Additionally, lens 1064 may serve one or more aesthetic purpose, such as by determining a lit and/or unlit appearance of the multiple LED devices 200B.

FIG. 1C shows a cross section of a three dimensional view of a LED array 1100. As shown, pixels in the LED array 1100 may be separated by trenches which are filled to form n-contacts 1140. The pixels may be grown on a substrate 1114 and may include a p-contact 1113, a p-GaN semiconductor layer 1112, an active region 1111, and an n-Gan semiconductor layer 1110. It will be understood that this structure is provided as an example only and one or more semiconductor or other applicable layers may be added, removed, or partially added or removed to implement the disclosure provided herein. A wavelength converting layer 1117 may be deposited on the semiconductor layer 1110 (or other applicable layer).

Passivation layers 1115 may be formed within the trenches 1130 and n-contacts 1140 (e.g., copper contacts) may be deposited within the trenches 1130, as shown. The passivation layers 1115 may separate at least a portion of the n-contacts 1140 from one or more layers of the semiconductor. According to an implementation, the n-contacts 1140, or other applicable material, within the trenches may extend into the wavelength converting layer 1117 such that the n-contacts 1140, or other applicable material, provide complete or partial optical isolation between the pixels.

Figure 1D:
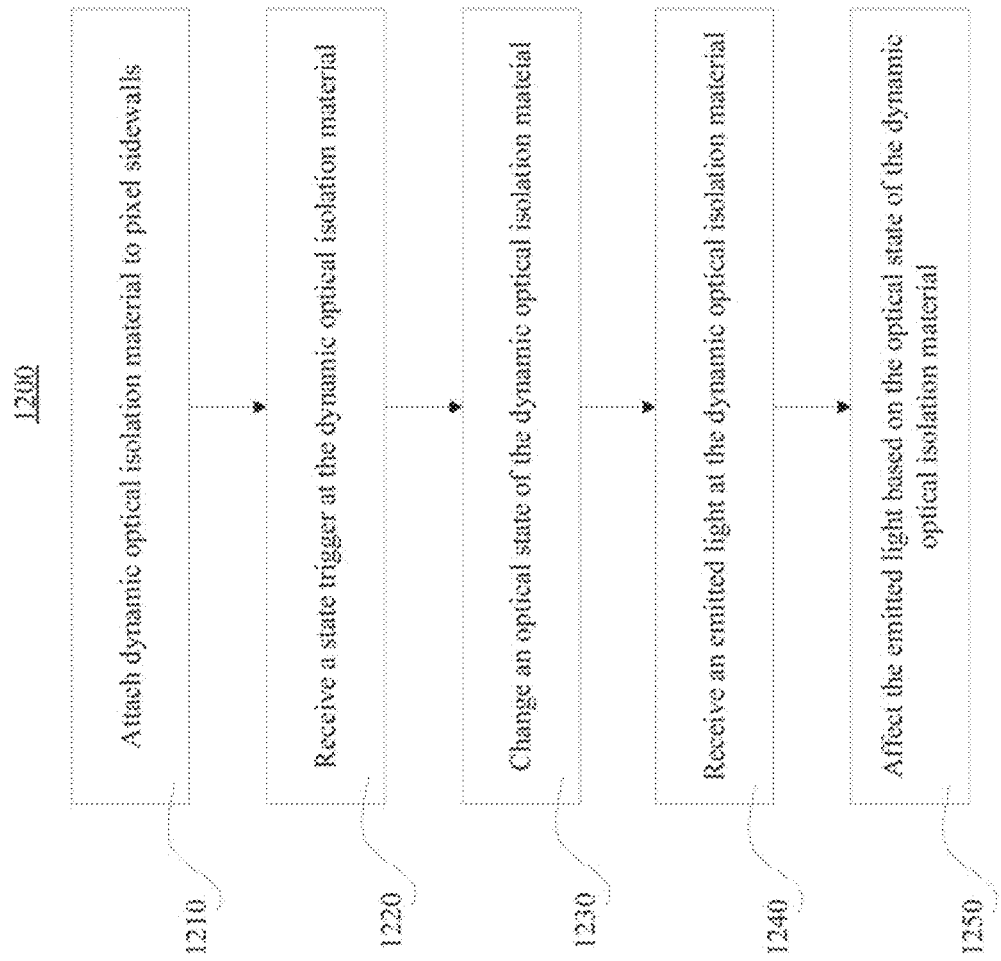
FIG. 1D is a method to affect light at the sidewalls of a pixel.

FIG. 1D shows a method 1200 for generating pixels in a pixel array, according to the subject matter disclosed herein. The pixels in such a pixel array may be sub-300 micron large and sidewall material deposition techniques specific to pixels in the sub-300 micron range may be used to deposit dynamic optical isolation material. As shown at step 1210, a dynamic optical isolation material may be attached to pixel sidewalls of pixels in a pixel array. It will be understood that although the term attached is used, attached may apply as being formed on, grown on, connected to, in contact with, or the like. At step 1220, a state trigger may be received at the dynamic optical isolation material. The state trigger may be a signal or a change in property such as, but not limited to, a temperature change. The state trigger may be provided by an electronic component such as a microprocessor or a controller, a pixel in a pixel array or may be generated by other pixels in the pixel array. At step 1230, an optical state of the dynamic optical isolation material may be changed based on the received state trigger. The change in optical state may configure the dynamic optical isolation material to interact with light in a manner that is different than the manner the dynamic optical isolation material interacts with light prior to the change in the optical state. At step 1240, an emitted light may be received at the dynamic optical isolation material and the dynamic optical isolation material may affect the light based on its optical state at step 1250. The emitted light may be generated by the pixel onto which the dynamic optical isolation material is attached to or may be generated by a different pixel.

The efficiency of pixel arrays may increase as a result of the dynamic optical isolation material disclosed herein. Cross talk may be reduced or eliminated as the dynamic optical isolation material may prevent the light from a given pixel to emit via its sidewalls into the lanes between pixels as well as an adjacent or proximate pixel that is turned off, mitigating or preventing an unintended cross lighting effect. Additionally, the dynamic optical isolation material may improve the contrast of a pixel array that emits segmented light such that there may be more clearly defined borders between two or more pixels adjacent or proximate to each other.

Alternatively, the efficiency of a pixel array may improve as a result of reduced or eliminated isolation between pixels, such as when neighboring pixels are powered on. The dynamic optical isolation material may be configured to allow light to pass through sidewalls such that a pixel array or a segment of a pixel array emits a more uniform light by, for example, emitting light into the lanes between pixels and into adjacent and proximate pixels to provide a uniform or gradient based change in light.

Figure 1F:
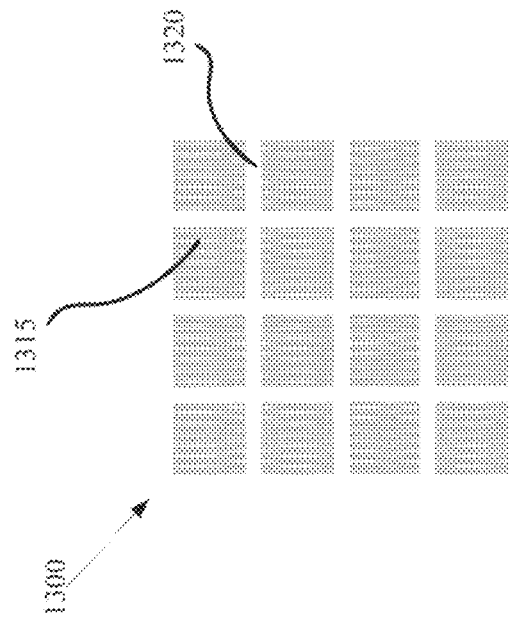
FIG. 1F is a top view diagram of a pixel array with dynamic optical isolation material in a transparent state.
Figure 1E:
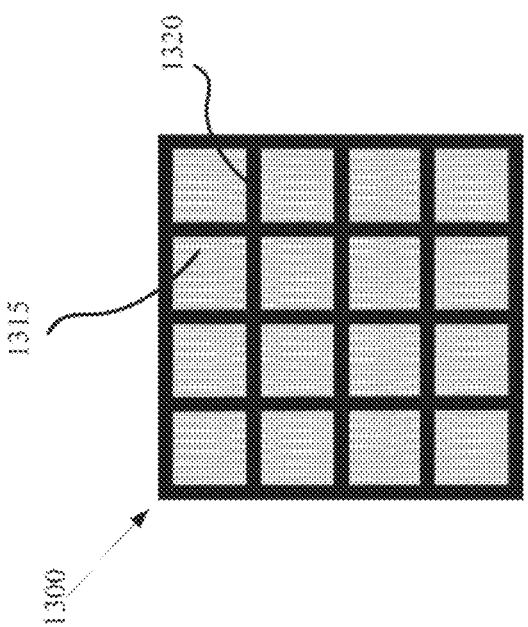
FIG. 1E is a top view diagram of a pixel array with dynamic optical isolation material in a opaque state.

According to step 1210 of FIG. 1D, as also shown in FIG. 1E, the dynamic optical isolation material 1320 may be attached to the sidewalls of the pixels 1315 in a pixel array 1300. As shown in FIG. 1a and FIG. 1b, the pixels may be sub-300 micron wide and may be, for example, 100 microns wide or 80 microns wide. The dynamic optical isolation material 1320 may occupy all or part of the space in the lanes created between the pixels, and the lanes may be, for example, 20 microns wide. The dynamic optical isolation material 1320 may be attached to the sidewalls of the pixels 1315 using any applicable technique including screen-printing, contact printing, drip coating, spray coating, lithography, or the like.

The dynamic optical isolation material 1320 may be thermochromic material, thermotropic material, electrochromic material or photochromic material.

Thermochromic material may change optical properties as a result of temperature changes, and may specifically change from a non-transparent state to a transparent state as a result of temperature change. The changes in optical properties for thermochromic material may be reversible. For example, a thermochromic material may change from an optical state A to an optical state B when the material's temperature increases above a temperature X. When the temperature cools to below the temperature X, or a different threshold temperature Y, the thermochromic material may change back to the optical state A. Optical properties that may change in a thermochromic material include the change in color and the respective opacity/transparency. Thermochromic material may include leuco dyes such that the leuco dyes are provided in a structural epoxy, a structural polymer or a homogeneous structural material to form the dynamic optical isolation material 1320.

Thermochromic material may change their optical state at a threshold temperature. Thermochromic material may include dye absorbing materials such that light that reaches the thermochromic material collides with said absorbing materials and is partially or fully prevented from being emitted past the thermochromic material as a result. For example, light may collide with absorbing materials and absorb photons, thereby containing a color at the thermochromic material instead of partially or fully emitting past the thermochromic material. Accordingly, the thermochromic material exhibits an opaque state, as light may not pass through the material. The thermochromic dyes may be encapsulated with a wax and developer in capsules that are the shell of a structural polymer. When the wax is in a solid state, the developer and dye may be associated and the thermochromic material may be colored. The wax may be configured to melt at a threshold temperature and the absorbing material may be configured to dissolve into the melted binder wax. The dissolving of the absorbing material results in a change in an optical state as light that reaches the thermochromic material does not interact with the absorbing material. As a result, the light may pass through the thermochromic material causing the thermochromic material to have a transparent state.

Thermotropic material may change optical properties as a result of temperature changes and may specifically change light scattering properties as a result of temperature change. The changes in optical properties for thermotropic material may be reversible. Thermotropic materials may include metal oxide beads in silicon or other organic polymer, porous metal oxide beads in silicone or other organic polymer, phase change materials in silicon or polymer matrix, liquid crystal capsules in a silicone or polymer matrix, or the like. Thermotropic material may be configured to provide light scattering modulation established based on changes in refractive index. As an example, thermotropic material may include a crystalline paraffin wax, which exhibits high scattering properties when the wax is solid. The wax may be configured to melt at the threshold temperature, resulting in a low scattering or non-scattering state as the melted wax may exhibit low or no scattering properties.

The light scattering modulation in thermotropic materials may be established based on changes in refractive index differences as a function of temperature, for example, in mixtures of organic polymers and metal oxides such as silicone with a high dn/dt. Alternatively, temperature sensitive liquid crystalline materials may transition to an isotropic phase at threshold temperatures. Alternatively or in addition, the thermotropic material may include porous silica material, which includes a large number of interfaces as a result of its porous structure. The pores may be filled with, for example, silicone and the thermotropic material containing the porous silica may change from a scattering state to a low scattering or non-scattering state as the temperature of the material reaches a threshold temperature. The scattering may reduce due to the refractive index of the silicone decreasing at the threshold temperature such that the refractive index difference between the silicone and the silica becomes smaller, thus leading to less scattering at or past the threshold temperature. The porous silica may have 50-1400 nm open porosity.

In an alternative configuration the thermotropic material may include salts that are configured to change scattering properties based on the hydration and dehydration properties of the salts such that a higher temperature may cause the salts to dehydrate, resulting in a higher scattering.

Electrochromic material may change optical properties as a result of charge applied to the electrochromic material to cause electrochemical redox reactions. The changes in optical properties for electrochromic material may be reversible. Electrochromic material may include transition metal oxides including tungsten oxide, NiO materials, polyaniline, viologens, polyoxotungstates, and the like. Electrochromic material may change optical properties including changing to a transparent state, an opaque state, or a reflective state as a result of an electric charge being applied to the material. As an example, when a voltage is applied to electrodes in connection with the electrochromic material, ions may migrate from one electrode location to a different electrode location. The migration may cause the particles in the Electrochromic material to change from a transparent state to a reflective state. Alternatively or in addition, the electrochromic material may contain a die that changes states when a current passes through the die.

Photochromic material may change optical properties as a result of changes in light intensity applied to the photochromic material. Specifically, photochromic material may change from a non-transparent state to a transparent state as a result of changes in light applied to the material. The changes in optical properties for photochromic material may be reversible. For example, a photochromic material may change from an optical state A to an optical state B when ultraviolet light is emitted onto the material. When the ultraviolet light is removed, the photochromic material may change back to exhibiting the optical state A. As a specific example, photochromic material may exhibit a non-transparent state when no light is incident on the material. When a pixel is activated such that the pixel emits a blue light, the blue light may reach the photochromic material and the photochromic material may change its optical state to a transparent state such that the light from the pixel emits through the material.

Dynamic optical isolation material 1320 may be attached to pixel sidewalls such that it is attached to all or part of the light-emitting component of the pixel and all or part of the wavelength converting layer of the pixel. An example pixel array is shown in FIG. 1I and described in more detail herein.

At step 1220 of FIG. 1D, as also shown in FIGS. 1E and 3b, a state trigger may be received at the dynamic optical isolation material 1320. A state trigger may be a condition, a property change, a signal, or the like, and may be received in the form of an optical addressing, an electrical addressing, a temperature change, or the like. An optical addressing may be a light based trigger such as emitting a UV light onto the dynamic optical isolation material. An electrical addressing may be based on a voltage or current applied to a dynamic optical isolation material. A temperature change may be caused by a heating or cooling component or by the heat generated by pixel array components including adjacent or proximate pixels when they are switched on.

A state trigger may be dynamic optical isolation material dependent such that a state trigger for a first material may not be a state trigger for a second material. As an example, a temperature increase to a threshold temperature X may be a state trigger for a thermochromic dynamic optical isolation material but may not be a state trigger for an electrochromic dynamic optical isolation material. Alternatively, as an example, applying a charge may be a state trigger for an electrochromic dynamic optical isolation material but applying the same charge may not be a state trigger for a thermochromic dynamic optical isolation material.

A state trigger may be provided explicitly or may be provided implicitly. An explicitly provided state trigger may be initiated by a pixel or external microcontroller, a sensor, or any component configured to provide an explicit state trigger. As an example, a microcontroller may be configured to initiate a charge that is applied to an electrochromic dynamic optical isolation material. The microcontroller may initiate the charge based on a signal or determination to change the optical state of a dynamic optical isolation material. As another example, a UV light emitter may emit UV light at a photochromic material based on a signal or determination to change the optical state of a dynamic optical isolation material.

An implicitly provided state trigger may be initiated as a result of a change in a condition. As an example, a first row of pixels in a pixel array may change from an inactive mode to an active mode. The pixels in the active mode may generate heat as byproduct of emitting light. The heat may result in a temperature increase beyond a temperature X, providing a state trigger to the thermotropic dynamic optical isolation material attached to a second row of pixels adjacent to the first row of pixels. A plurality of pixels may be required to generate a threshold amount of heat to increase the temperature beyond a threshold temperature X, to provide a state trigger for an adjacent pixel to change an optical state.

An implicit state trigger for dynamic isolation material attached to a pixel may be provided by the pixel itself. As an example, the heat generated by the given pixel, when activated, may provide an implicit state trigger as the heat may cause the temperature at the dynamic isolation optical isolation material to rise above a state trigger generating threshold temperature X. As an example, the temperature X may be between 40° C. and 150° C.

An implicit state trigger for dynamic isolation material attached to a pixel may be provided by a combination of the pixel itself and one or more adjacent or proximate pixels. As an example, the heat generated by the given pixel alone, when activated, may not be sufficient to raise the temperature at its dynamic isolation material above a threshold temperature X. However, the combination of the heat generated by the activated pixel and the heat generated by an adjacent pixel may cause the temperature at the dynamic optical isolation material to rise above a state trigger generating threshold temperature X. Additionally, if the dynamic optical isolation materials of adjacent or proximate pixels have the same properties, then the dynamic optical isolation materials of such pixels may each change an optical state based on the same state trigger.

At step 1230 of FIG. 1D, an optical state of dynamic optical isolation material may be changed based on a received state trigger. The change in optical state may result in a dynamic optical isolation material to switch between one or more states such as a transparent state, a non-transparent or absorbing state, a scattering state, a non-scattering state, or a reflective state. It will be understood that a change in optical state may be a substantial change from a first state to a second state but need not be an all-or-nothing binary on/off designation. For example, a dynamic optical isolation material may change from an opaque state to a transparent state such that the material is 95% transparent. Notably, although the dynamic optical isolation material may still prevent 5% of light from being emitted, it will be understood that the material is substantially transparent. It will also be understood that although a 95%/5% non-limiting example is used herein, the percentages or criteria for a change in state may depend on the type of dynamic optical isolation material, the optical states, the application of the pixel array, or the like.

FIG. 1E shows the pixel array 1300 with pixels 1315 having sidewalls with dynamic optical isolation material 1320. The dynamic optical isolation material 1320 in FIG. 1E may be in an opaque state as represented by the dark dynamic optical isolation material 1320. A state trigger may be received at the dynamic optical isolation material and the state trigger may be, for example, the dynamic optical isolation material being heated to a threshold temperature X. The state trigger may be an explicit temperature increase to a threshold temperature X at the dynamic optical isolation material 1320 and caused by a heating mechanism. Alternatively, a state trigger may be an implicit trigger such that the pixels 1315 may be activated and the heat dissipated by the pixels may cause the temperature at the optical isolation material 1320 to reach the threshold temperature X.

FIG. 1F shows the pixel array with the dynamic optical isolation material 1320 in a transparent state, as represented by the light dynamic optical isolation material 1320. The change from the opaque state in FIG. 1E to the transparent state in FIG. 1F may be a result of the implicit or explicit state trigger of the dynamic optical isolation material 1320 temperature reaching above a threshold temperature X.

Figure 1G:
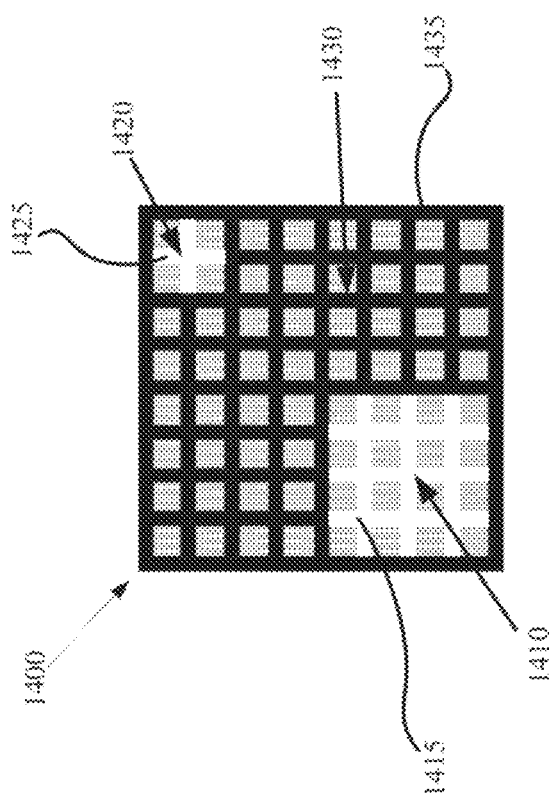
FIG. 1G is a top view diagram of a pixel array with portions of the array in an active state and other portions of the array in an inactive state.
Figure 11H:
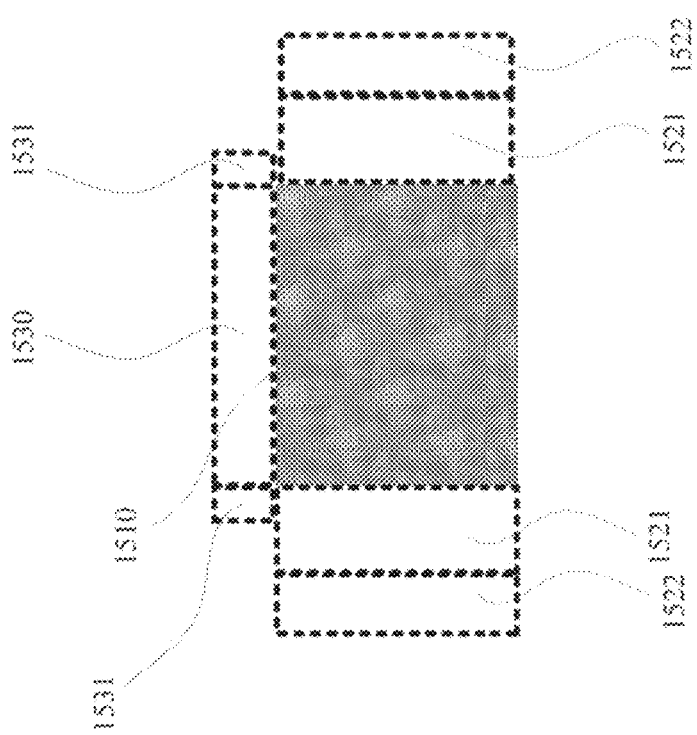
Figure 11:
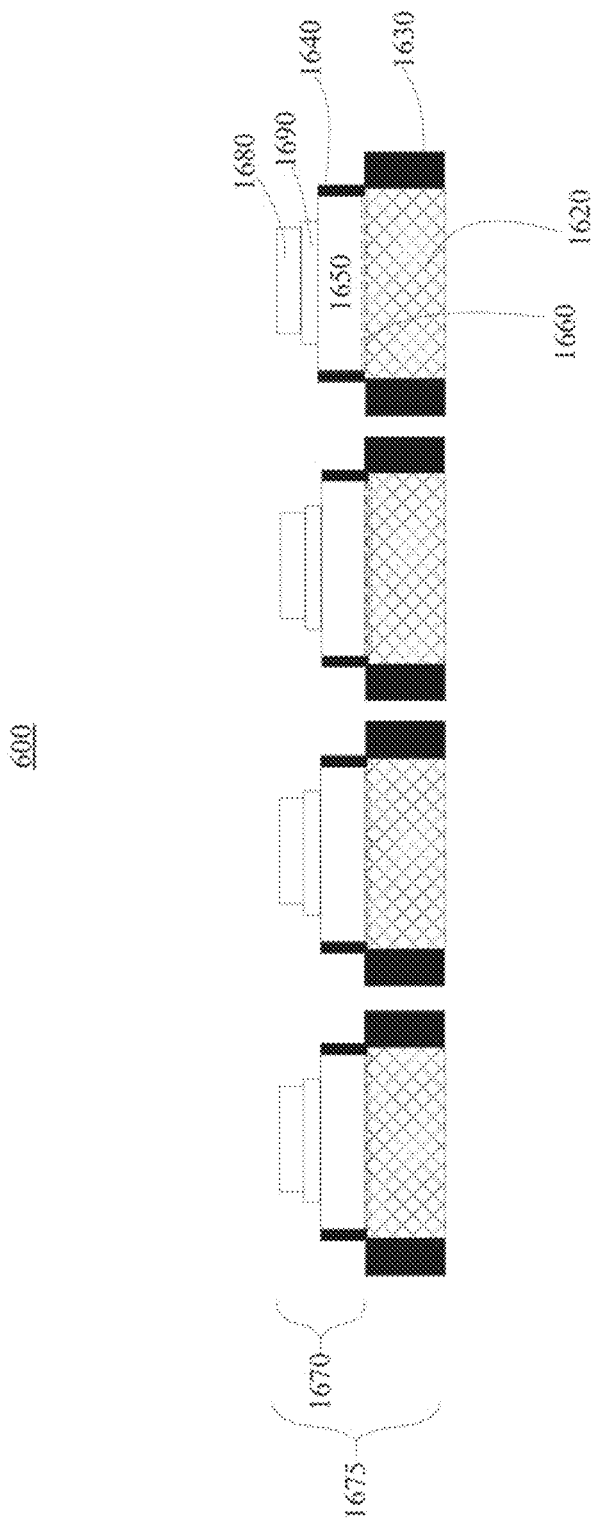

FIG. 1G shows a pixel array 1400 that contains a plurality of pixels arranged in a matrix. It will be understood that although a matrix pixel arrangement is shown, this disclosure may be applied to any pixel array configured to include pixels adjacent or proximate to each other. The pixel array 1400 may be segmented such that different segments of the array may be operated independently of each other. As an example, as shown in FIG. 1G, the pixel array 1400 may be contain three segments 1410, 1420 and 1430 that are operated independently. It will be understood that although specific segments are shown in this example, the segment arrangement may be dynamic such that specific segments may be utilized for a given application and the same pixel array may be segmented in a different manner with different pixels per segment, for a different application.

As an example, pixel array 1400 may correspond to a front facing automotive lighting system. The dynamic optical isolation material 1415, 1425, and 1435 may contain thermochromic material. The pixel array may receive input from an automotive sensor configured to detect the location of oncoming traffic and may activate pixels such that light emitted from the pixel array illuminates the scene for a driver without emitting light at or towards the oncoming traffic. Based on the input from the automotive sensor, pixels in segments 1410 and 1420 may be activated and pixel in segment 1430 may be inactive. The dynamic optical isolation material 1415, 1425, and 1435 may be a thermochromic material configured to change from an opaque state below a threshold temperature X to a transparent state at or above threshold temperature X. The active pixels in segments 1410 and 1420 may generate heat such that the temperature at the dynamic optical isolation material 1415 and 1425 increases to the threshold temperature X. The temperature at the dynamic optical isolation material 1435 adjacent to the inactive pixels in segment 1430 may remain below the threshold temperature X. As a result, as shown in FIG. 1G, the dynamic optical isolation material 1415 and 1425 may change from an opaque optical state to a transparent optical state. The dynamic optical isolation material 1435 may remain in an opaque optical state. This configuration may allow a more uniform light to be emitted by segments 1410 and 1420 as light from an emitter may pass through the sidewalls of the active pixels towards adjacent or proximate pixels. This configuration may also provide a sharp contrast at the edges of the segments 1410 and 1420 such that there is no cross talk between the active pixels of segments 1410 and 1420 and the inactive pixels of segment 1430.

As another example, pixel array 1400 may correspond to a street light panel. The dynamic optical isolation material 1415, 1425, and 1435 may include photochromic material. Further, the dynamic optical isolation material 1415, 1425, and 1435 may be a photochromic material configured to change from an opaque state when no UV light is emitted onto it to a transparent state when UV light is emitted onto it. The pixel array may receive input from a controller regarding which pixel segments are to be illuminated based on foot traffic patterns on a corresponding street. Based on the input from the controller, a UV light emitter may emit UV light at the pixels in segments 1410 and 1420 such that the UV light is not emitted at pixels in segment 1430. As a result, as shown in FIG. 1G, the dynamic optical isolation material 1415 and 1425 may change from an opaque optical state to a transparent optical state. The dynamic optical isolation material 1435 may remain in an opaque optical state. This configuration may allow a more uniform light to be emitted by segments 1410 and 1420 as light from an emitter may pass through the sidewalls of the active pixels towards adjacent or proximate pixels. This configuration may also provide a sharp contrast at the edges of the segments 1410 and 1420 such that there is no cross talk between the active pixels of segments 1410 and 1420 and the inactive pixels of segment 1430.

As shown in FIG. 1H, multiple dynamic optical isolation materials 1521 and 1522 may be attached to the sidewalls of a pixel 1510. The multiple dynamic optical isolation materials 1521 and 1522 may be different types of material such as, for example, a thermotropic material and a thermochromic material. Alternatively, the multiple dynamic optical isolation materials 1521 and 1522 may be the same type of material with different optical properties. As an example, the materials 1521 and 1522 may both be thermochromic such that the material 1521 may change an optical state at a lower threshold temperature than the material 1522. Multiple dynamic optical isolation materials may allow for more precise light control when compared to a single material. As an example, material 1521 may be thermochromic and material 1522 may be thermotropic. A temperature X may be a state trigger for both materials 1521 and 1522 such that the thermochromic material 1521 may change to a transparent state and thermotropic material 1522 may change to a non-scattering state. The transparent and non-scattering states may allow for light emitted by the pixel 1510 to exit through the sidewalls and towards other adjacent or proximate pixels. A reduction in the temperature below temperature X may initiate a second state trigger for both materials 1521 and 1522 such that thermochromic material 1521 may enter an opaque state and thermotropic material 1522 may enter a reflective state. The opaque state of the thermochromic material 1521 may prevent light emitted by the pixel 1510 from exiting the pixel via the sidewalls. The reflective state of the thermotropic material 1522 may cause light emitted by an adjacent pixel to reflect away from the pixel 1510 when the light reaches the material 1522. The combined resulting effect of the two dynamic optical isolation materials may be that external light is emitted away from the sidewalls of pixel 1510 and internal light does not exit the pixel 1510 via its sidewalls.

According to an embodiment, multiple dynamic optical isolation materials 1530 and 1531 may be attached to the non-sidewall surface (e.g., top surface, bottom surface, etc.) of a pixel 1510. The multiple dynamic optical isolation materials 1530 and 1531 may be a single layer or material or may be different material, as shown. The multiple dynamic optical isolation material 1530 and 1531 may be deposited at the same time as or at a different time than materials 1521 and 1522. The multiple dynamic optical isolation materials 1530 and 1531 may be different types of material such as, for example, a thermotropic material and a thermochromic material. Alternatively, the multiple dynamic optical isolation materials 1530 and 1531 may be the same type of material with different optical properties. As an example, the dynamic optical isolation materials 1530 and 1531 may both be thermochromic such that the dynamic optical isolation material 1531 may change an optical state at a lower threshold temperature than the material 1530, or vice versa. Multiple dynamic optical isolation materials 1530 and 1531 may allow for reduction in cross talk and/or may be used to alternate between an on-state and off state of the pixel 1510.

FIG. 1I shows an example pixel array 600 including pixels 1675 manufactured in accordance with the techniques disclosed herein and including light-emitting devices 1670 that include a GaN layer 1650, active region 1690, solder 1680, and pattern sapphire substrate (PSS) pattern 1660. The wavelength converting layers 1620 may be mounted onto the light emitting devices 1670, as shown.

A wavelength converting layer may contain material configured to convert one or more properties of light. The wavelength converting layer may convert a property of light, such as, but not limited to, its wavelength, its phase, or the like. A wavelength converting layer may convert a property of light based on a collision of one or more particles in a wavelength converting layer with an incoming light, followed by a photon release.

A wavelength converting layer may contain applicable luminescent or optically scattering material such as phosphor particles with or without activation from rare earth ions, phosphor in glass (PiG), phosphor in silicon, ceramic phosphor, zinc barium borate, Ce(III) doped garnet materials such as $(Y,Gd)_3(AlGa)_5O_{12}$:Ce, aluminum nitride, aluminum oxynitride (AlON), barium sulfate, barium titanate, calcium titanate, cubic zirconia, diamond, gadolinium gallium garnet (GGG), lead lanthanum zirconate titanate (PLZT), lead zirconate titanate (PZT), sapphire, silicon aluminum oxynitride (SiAlON), silicon carbide, silicon oxynitride (SiON), strontium titanate, titanium oxide, yttrium aluminum garnet (YAG), zinc selenide, zinc sulfide, and zinc telluride, diamond, silicon carbide (SiC), single crystal aluminum nitride (AlN), gallium nitride (GaN), or aluminum gallium nitride (AlGaN) or any transparent, translucent, or scattering ceramic, optical glass, high index glass, sapphire, alumina, III-V semiconductors such as gallium phosphide, II-VI semiconductors such as zinc sulfide, zinc selenide, and zinc telluride, group IV semiconductors and compounds, metal oxides, metal fluorides, an oxide of any of the following: aluminum, antimony, arsenic, bismuth, calcium, copper, gallium, germanium, lanthanum, lead, niobium, phosphorus, tellurium, thallium, titanium, tungsten, zinc, or zirconium, polycrystalline aluminum oxide (transparent alumina), aluminum oxynitride (AlON), cubic zirconia (CZ), gadolinium gallium garnet (GGG), gallium phosphide (GaP), lead zirconate titanate (PZT), silicon aluminum oxynitride (SiAlON), silicon carbide (SiC), silicon oxynitride (SiON), strontium titanate, yttrium aluminum garnet (YAG), zinc sulfide (ZnS), spinel, Schott glass LaFN21, LaSFN35, LaF2, LaF3, LaF10, NZK7, NLAF21, LaSFN18, SF59, or LaSF3, Ohara glass SLAM60 or SLAH51, and may comprise nitride luminescent material, garnet luminescent material, orthosilicate luminescent material, SiAlON luminescent material, aluminate luminescent material, oxynitride luminescent material, halogenide luminescent material, oxyhalogenide luminescent material, sulfide luminescent material and/or oxysulfide luminescent material, luminescent quantum dots comprising core materials chosen from cadmium sulfide, cadmium selenide, zinc sulfide, zinc selenide, and may be chosen form $SrLiAl_3N_4$:Eu (II) (strontium-lithium-aluminum nitride: europium (II)) class, Eu(II) doped nitride phosphors like $(Ba,Sr,Ca)2Si5-xAlxOxN8$:Eu, $(Sr, Ca)SiAlN3$:Eu or $SrLiAl3N4$:Eu, or any combination thereof.

Dynamic optical isolation materials 1630 may be applied to the wavelength converting layers 1620. The wavelength converting layers 1620 may be mounted onto a GaN layer 1650 via a pattern sapphire substrate (PSS) pattern 1660. The GaN layer 1650 may be bonded to or grown over an active region 1690 and the light-emitting device 1670 may be connected to a solder 780. Dynamic optical isolator material 1640 may also be applied to the sidewalls of the GaN layer 1650.

As an example, the pixels 1675 of FIG. 1I may correspond to the pixels 111 of FIG. 1A. Specifically, as shown in FIG. 1A, the pixels 111 may correspond to the pixels 1675 of FIG. 1I after the wavelength converting layers 1620 are mounted onto the light emitting devices 1670. When the pixels 111 or 1675 are activated, the respective active regions 1690 of the pixels may generate a light. The light may pass through the wavelength converting layer 1620 and may substantially be emitted from the surface of the wavelength converting layer 1620. Light that reaches dynamic optical isolation material 1630 and/or 1640 may pass through the dynamic optical isolation material 1630 and/or 1640 if the material is in a transparent state. Alternatively or in addition, the light may be altered, absorbed, reflected or otherwise modified based on the optical state of the dynamic optical isolation material 1630 and/or 1640.

Figure 2A:
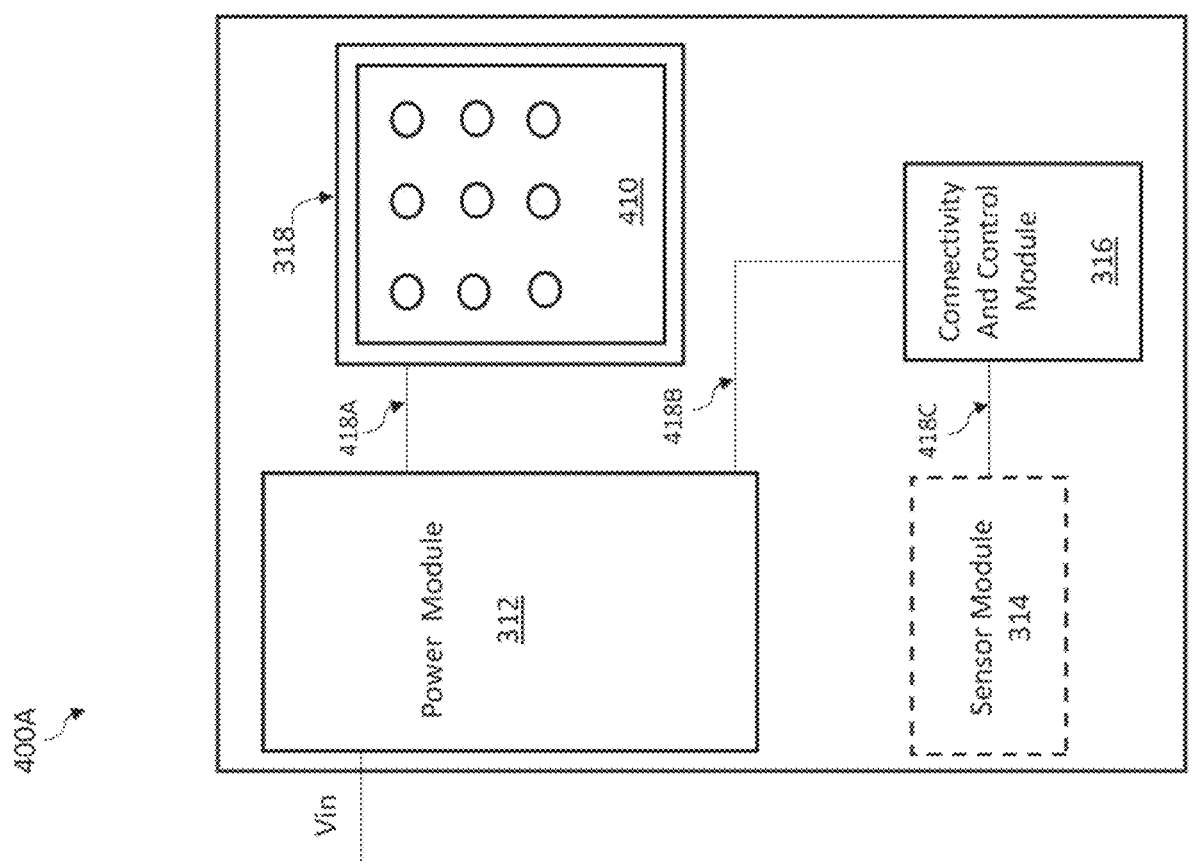
FIG. 2A is a top view of the electronics board with LED array attached to the substrate at the LED device attach region in one embodiment.

FIG. 2A is a top view of an electronics board with an LED array 410 attached to a substrate at the LED device attach region 318 in one embodiment. The electronics board together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 2A, the connectivity and control module 316 receives sensor signals from the sensor module 314 over trace 418C. Pixels in the LED array 410 may be created in accordance with the steps FIG. 1D and as shown in FIGS. 1E-H.

Figure 2B:
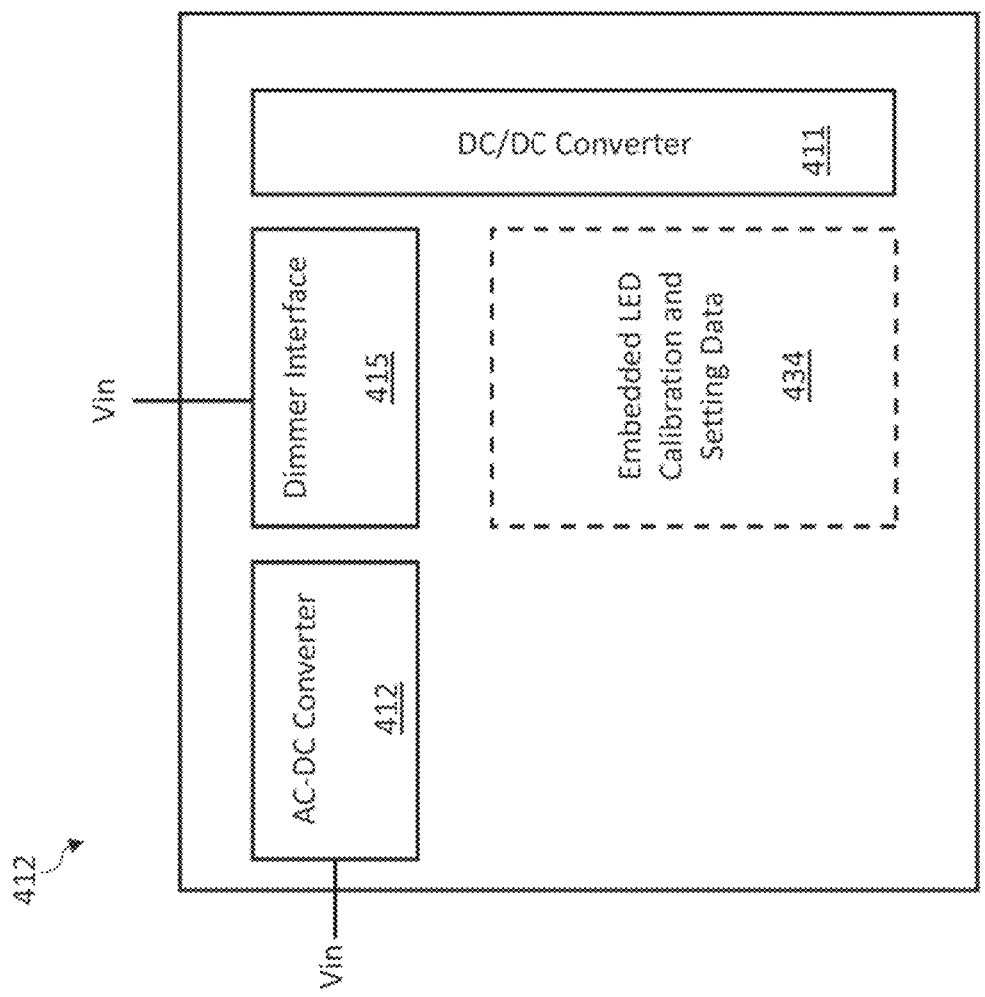
FIG. 2B is a diagram of one embodiment of a two channel integrated LED lighting system with electronic components mounted on two surfaces of a circuit board.

FIG. 2B illustrates one embodiment of a two channel integrated LED lighting system with electronic components mounted on two surfaces of a circuit board 499. As shown in FIG. 2B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 2B does not include a sensor module (as described in FIG. 2A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 2C:
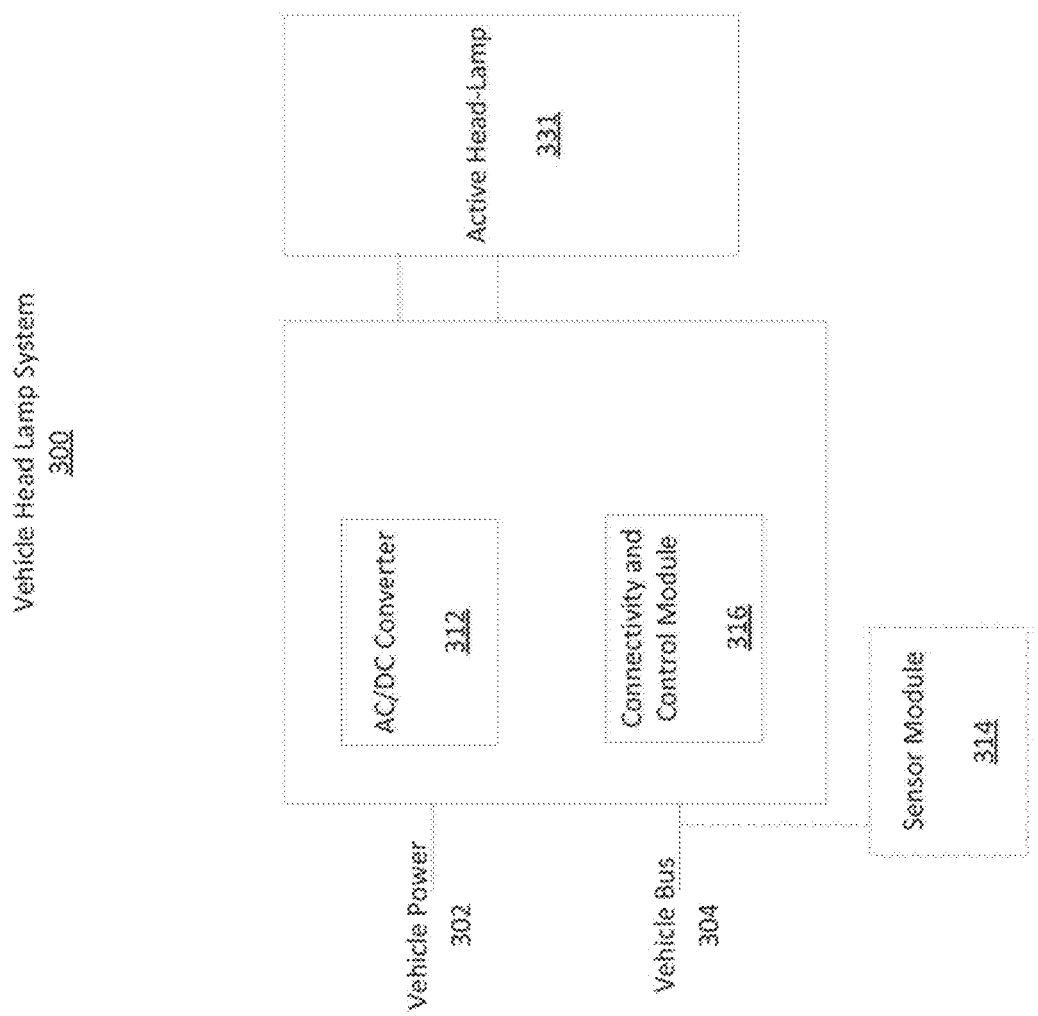
FIG. 2C is an example vehicle headlamp system.

FIG. 2C shows an example vehicle headlamp system 300 including a vehicle power 302 including a data bus 304. A sensor module 307 may be connected to the data bus 304 to provide data related to environment conditions (e.g. ambient light conditions, temperature, time, rain, fog, etc), vehicle condition (parked, in-motion, speed, direction), presence/position of other vehicles, pedestrians, objects, or the like. The sensor module 307 may be similar to or the same as the sensor module 314 of FIG. 2A. AC/DC Converter 305 may be connected to the vehicle power 302. Pixels in the active headlamp 330 may be created in accordance with the steps FIG. 1D and as shown in FIGS. 1E-H.

The power module 312 (AC/DC converter) of FIG. 2C may be the same as or similar to the AC/DC converter 412 of FIG. 2B and may receive AC power from the vehicle power 302. It may convert the AC power to DC power as described in FIG. 2B for AC/DC converter 412. The vehicle head lamp system 300 may include an active head lamp 330 which receives one or more inputs provided by or based on the AC/DC converter 305, connectivity and control module 306, and/or sensor module 307. As an example, the sensor module 307 may detect the presence of a pedestrian such that the pedestrian is not well lit, which may reduce the likelihood that a driver sees the pedestrian. Based on such sensor input, the connectivity and control module 306 may output data to the active head lamp 330 using power provided from the AC/DC converter 305 such that the output data activates a subset of LEDs in an LED array contained within active head lamp 330. The subset of LEDs in the LED array, when activated, may emit light in the direction where the sensor module 307 sensed the presence of the pedestrian. These subset of LEDs may be deactivated or their light beam direction may otherwise be modified after the sensor module 207 provides updated data confirming that the pedestrian is no longer in a path of the vehicle that includes vehicle head lamp system.

Figure 3:
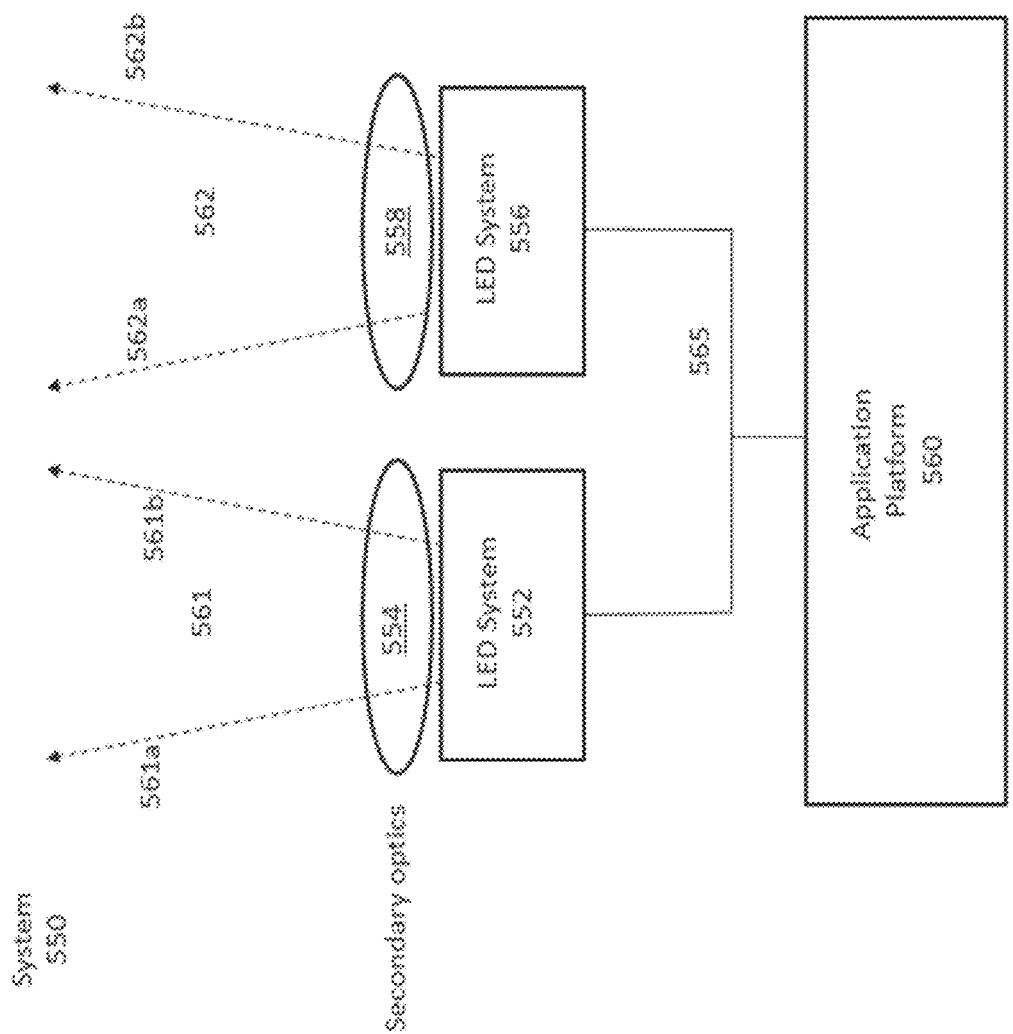
FIG. 3 shows an example illumination system.

FIG. 3 shows an example system 1350 which includes an application platform 1360, LED systems 552 and 556, and optics 554 and 558. Pixels in the arrays of LED systems 552 and 556 may be created in accordance with the steps FIG. 1D and as shown in FIGS. 1E-H. The LED System 552 produces light beams 561 shown between arrows 561a and 561b. The LED System 556 may produce light beams 562 between arrows 562a and 562b. In the embodiment shown in FIG. 3, the light emitted from LED System 552 passes through secondary optics 554, and the light emitted from the LED System 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 1350 may be a mobile phone of a camera flash system, indoor residential or commercial lighting, outdoor light such as street lighting, an automobile, a medical device, AR/VR devices, and robotic devices. The LED System 400A shown in FIG. 2A and vehicle head lamp system 300 shown in FIG. 2C illustrate LED systems 552 and 556 in example embodiments.

The application platform 1360 may provide power to the LED systems 552 and/or 556 via a power bus via line 565 or other applicable input, as discussed herein. Further, application platform 1360 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 1360. Alternatively or in addition, as shown in the LED system 400 of FIG. 2A, each LED System 552 and 556 may include its own sensor module, connectivity and control module, power module, and/or LED devices.

In embodiments, application platform 1360 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 1360 may represent an automobile and LED system 552 and LED system 556 may represent automobile headlights. In various embodiments, the system 1350 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors (e.g., similar to sensors module 314 of FIG. 2A and 307 of FIG. 2C) that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described. Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

The invention claimed is:

1. A device comprising:
a microLED array comprising a plurality of microLEDs, each microLED separated from an adjacent microLED in the array by a trench, each microLED having sidewalls; and
a dynamic optical isolation material attached to a sidewall of a first microLED in the array, the sidewall located in the trench between the first microLED and another microLED in the array, the dynamic optical isolation material switchable between a plurality of optical states comprising a first optical state configured to hinder a transmission of light through the dynamic optical isolation material and a second optical state configured to allow light to pass through the dynamic optical isolation material, the dynamic optical isolation material configured to switch between optical states based on a state trigger,
the trench between the first microLED and the another microLED in the array configured so that when the dynamic optical isolation material in the trench is in the second optical state, the trench is substantially transparent.

2. The device of claim 1, wherein each microLED is individually addressable.

3. The device of claim 1, wherein the microLED array has a monolithic structure.

4. The device of claim 1, wherein each microLED has a width of 40 μm or less.

5. The device of claim 1, wherein each microLED is a pixel element.

6. The device of claim 1, comprising:
a controller configured to send input to the microLED array to illuminate a contiguous subset of the plurality of microLEDs and wherein the dynamic optical isolation material in the trenches between two microLEDs in the contiguous subset is in the second optical state.

7. An illumination system comprising:
an LED array comprising:
a plurality of LEDs, each LED separated from an adjacent LED in the array by a trench, each LED having sidewalls; and
a dynamic optical isolation material attached to a sidewall of a first LED in the array, the sidewall located in the trench between the first LED and another LED in the array, the dynamic optical isolation material switchable between a plurality of optical states comprising a first optical state configured to hinder a transmission of light through the dynamic optical isolation material and a second optical state configured to allow light to pass through the dynamic optical isolation material, the dynamic optical isolation material configured to switch between optical states based on a state trigger,
the trench between the first LED and the another LED in the array configured so that when the dynamic optical isolation material in the trench is in the second optical state, the trench is substantially transparent; and
one or more optical elements arranged to form an output illumination beam from light emitted by the LEDs in the LED array.

8. The illumination system of claim 7, wherein the one or more optical elements comprises a lens.

9. The illumination system of claim 7, wherein the one or more optical elements comprises a waveguide.

10. The illumination system of claim 7, wherein each LED in the LED array is individually addressable.

11. The illumination system of claim 7, wherein each LED in the LED array has a width of 100 μm or less.

12. The illumination system of claim 7, wherein each LED is a microLED.

13. The illumination system of claim 7, comprising:
a controller configured to send input to the microLED array to illuminate a contiguous subset of the plurality of microLEDs and wherein the dynamic optical isolation material in the trenches between two microLEDs in the contiguous subset is in the second optical state.

14. A vehicle headlamp comprising the illumination system of claim 7, wherein the one or more optical elements comprises a lens.

15. A mobile device comprising:
a camera; and
a flash illumination system comprising:
an LED array comprising:
a plurality of LEDs, each LED separated from an adjacent LED in the array by a trench, each LED having sidewalls; and
a dynamic optical isolation material attached to a sidewall of a first LED in the array, the sidewall located in the trench between the first LED and another LED in the array, the dynamic optical isolation material switchable between a plurality of optical states comprising a first optical state configured to hinder a transmission of light through the dynamic optical isolation material and a second optical state configured to allow light to pass through the dynamic optical isolation material, the dynamic optical isolation material configured to switch between optical states based on a state trigger, the trench between the first LED and the another LED in the array configured so that when the dynamic optical isolation material in the trench is in the second optical state, the trench is substantially transparent; and
a lens arranged to form an output flash illumination beam from light emitted by the LED pixels in the LED array.

16. The mobile device of claim 15, wherein each LED in the LED array is individually addressable.

17. The mobile device of claim 15, wherein the LED array has a monolithic structure.

18. The mobile device of claim 15, wherein each LED in the LED array has a width of 100 μm or less.

19. The mobile device of claim 15, wherein each LED is a microLED.

20. The mobile device of claim 15, comprising:
a controller configured to send input to the microLED array to illuminate a contiguous subset of the plurality of microLEDs and wherein the dynamic optical isolation material in the trenches between two microLEDs in the contiguous subset is in the second optical state.

* * * * *